(12) United States Patent
Vaartstra et al.

(10) Patent No.: US 7,250,367 B2
(45) Date of Patent: Jul. 31, 2007

(54) DEPOSITION METHODS USING HETEROLEPTIC PRECURSORS

(75) Inventors: Brian A. Vaartstra, Nampa, ID (US); Donald Westmoreland, Boise, ID (US); Eugene P. Marsh, Boise, ID (US); Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 300 days.

(21) Appl. No.: 10/932,149

(22) Filed: Sep. 1, 2004

(65) Prior Publication Data

US 2006/0046521 A1    Mar. 2, 2006

(51) Int. Cl.
*H01L 21/44* (2006.01)
(52) U.S. Cl. ..................................... 438/680
(58) Field of Classification Search ................ 257/703, 257/705, 759, 761; 438/679–681, 780, 790
See application file for complete search history.

(56) References Cited

U.S. PATENT DOCUMENTS

| | | | |
|---|---|---|---|
| 6,235,695 B1 * | 5/2001 | Blum et al. .................. | 510/220 |
| 6,527,855 B2 | 3/2003 | DelaRosa et al. | |
| 6,552,209 B1 | 4/2003 | Lei et al. | |
| 6,656,835 B2 | 12/2003 | Marsh et al. | |
| 6,730,163 B2 | 5/2004 | Vaartstra | |
| 6,984,591 B1 | 1/2006 | Buchanan et al. | |
| 2002/0098346 A1 | 7/2002 | Yitzchaik | |
| 2003/0233976 A1 | 12/2003 | Marsh et al. | |
| 2004/0041194 A1 | 3/2004 | Marsh | |
| 2004/0043578 A1 | 3/2004 | Marsh | |
| 2004/0266641 A1 * | 12/2004 | Gentschev et al. ......... | 510/312 |

FOREIGN PATENT DOCUMENTS

| | | | |
|---|---|---|---|
| JP | 2000-315409 | * | 10/2000 |
| KR | 2001-014379 | * | 3/2001 |
| KR | 2001-077804 | * | 12/2001 |
| KR | 2002-044318 | * | 7/2002 |

OTHER PUBLICATIONS

Jung-Hyun Lee, Shi-Woo Rhee, Chemical Vapor Deposition of Barium Strontium Titanate Films with Direct Light Injection of Single-Mixture Solution, Journal of the Electrochemical Society, vol. 146, No. 10, pp. 3783-3787.
M. Leskela and M. Ritala, ALD Precursor Chemistry: Evolution and Future Challenges, J. Phys. IV France 9 1999, pp. 837-852.
Sean T. Barry et al, Monomeric Chelated Amides of Aluminum and Gallium: Volatile, Miscible Liquid Precursors for CVD, Harvard University Chemical Laboratories, Mater. Res. Soc. Symp. Proc., 2000, vol. 606, pp. 1-7.
U.S. Appl. No. 10/637,362, filed Aug. 8, 2003, Marsh.

* cited by examiner

*Primary Examiner*—Calvin Lee
(74) *Attorney, Agent, or Firm*—Wells St. John P.S.

(57) ABSTRACT

An ALD method includes exposing a substrate to a first precursor including a plurality of different ligands, chemisorbing a precursor monolayer on the substrate, and reacting a second precursor with the precursor monolayer to yield a product monolayer. A surface reactive ligand exhibits a chemisorption affinity that exceeds the chemisorption affinity exhibited by a gas reactive ligand. Another deposition method includes exposing a substrate to a precursor containing an amino and/or imino ligand and a halide ligand and depositing a layer. The precursor exhibits a volatility that exceeds the volatility with a halide ligand taking the place of each amino and/or imino ligand. The precursor exhibits a thermal stability that exceeds the thermal stability with an amino and/or imino ligand taking the place of each halide ligand. The layer may exhibit less halogen content than with a halide ligand taking the place of each amino and/or imino ligand.

45 Claims, 4 Drawing Sheets

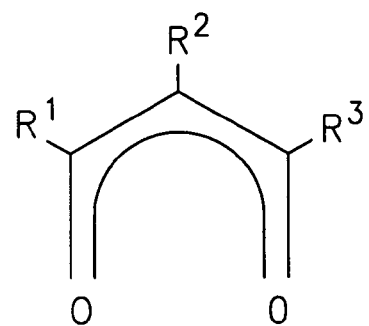
(a)
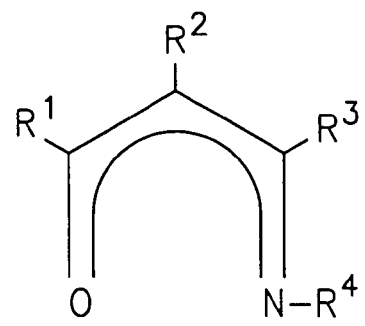
(b)
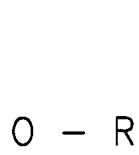
(c)
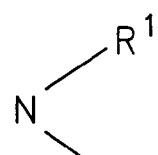
(d)
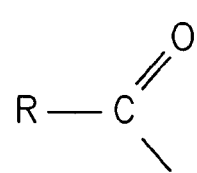
(e)
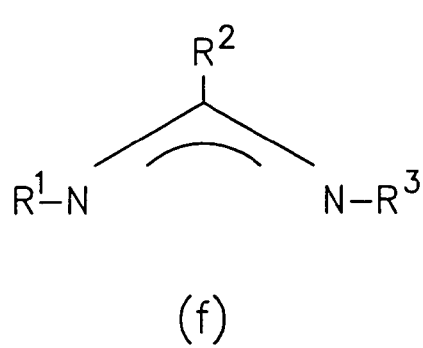
(f)
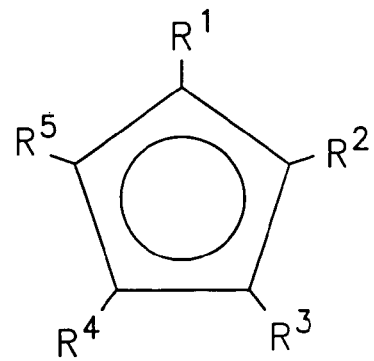
(g)

US 7,250,367 B2

DEPOSITION METHODS USING HETEROLEPTIC PRECURSORS

TECHNICAL FIELD

The invention pertains to deposition methods that use heteroleptic precursors, including CVD and ALD.

BACKGROUND OF THE INVENTION

Atomic layer deposition (ALD) is recognized as a deposition technique that forms high quality materials with minimal defects and tight statistical process control. Even so, new deposition precursors and methods are sought that may be particularly suited to ALD. ALD of metal, metal oxide, and metal nitride films is typically accomplished with known organometallic precursors known as homoleptic compounds. Such compounds include a complex of a metal cation with multiple identical ligands. Common examples include $Ti(NMe_2)_4$, $TiCl_4$, $Hf(NMe_2)_4$, $HfCl_4$, $WF_6$, and others, where Me represents $CH_3$. Given the uniform chemical properties exhibited among the ligands of homoleptic compounds, the functionality of such precursors may be easily determined and matched with a desired deposition process.

A wide variety of heteroleptic compounds has recently been identified, such as in U.S. Pat. No. 6,632,279 issued to Ritala, U.S. Pat. No. 6,548,424 issued to Putkonen, and U.S. Pat. No. 6,552,209 issued to Lei. Such references, as well as others, identify numerous anionic and neutral ligands that may be used in organometallic precursors. However, given the large number of possible combinations of the numerous ligands and metal cations, truly myriad possible precursors have been identified. Little or no knowledge exists regarding any basis for selection of heteroleptic compounds as opposed to homoleptic compounds. Since different ligands exhibiting different chemical properties may exist in a heteroleptic compound, clearly the functionality of heteroleptic compounds cannot be easily matched to a desired deposition process, as is done with homoleptic compounds. Instead, differing and/or conflicting functionalities of heteroleptic compound ligands might introduce undesired deposited material defects and process complications into otherwise low defect, highly controllable ALD processes. Accordingly, a need exists for ALD methods matched to specified functionalities uniquely achievable with heteroleptic precursors.

Chemical vapor deposition (CVD) constitutes a well-developed technology, but further improvements continue to be made. Heteroleptic compounds may also have application in CVD methods and a desire exists to identify compounds that may be more advantageous in CVD compared to conventional homoleptic compounds.

SUMMARY OF THE INVENTION

According to one aspect of the invention, an ALD method includes providing a deposition substrate and exposing the substrate to a first precursor including a metal or semimetal and a plurality of different ligands, chemisorbing a precursor monolayer on the substrate using the first precursor, and reacting a second precursor with the precursor monolayer. The method includes modifying the precursor monolayer and yielding a product monolayer consisting essentially of the metal, the semimetal, or an oxide, nitride, silicide, sulfide, or selenide of the metal or semimetal. A surface reactive ligand of the first precursor exhibits a chemisorption affinity for the substrate that exceeds the chemisorption affinity exhibited by a gas reactive ligand of the first precursor.

By way of example, the gas reactive ligand of the first precursor may remain as a gas reactive ligand of the precursor monolayer after the chemisorption. The gas reactive ligand may exhibit a thermal stability that exceeds the thermal stability exhibited by the surface reactive ligand. Also, reacting the second precursor with the precursor monolayer may include reacting the second precursor with the gas reactive ligand. The plurality of ligands may include ketoiminate and/or amidinate. The second precursor may consist of at least one of $O_2$, $O_3$, $Si_2H_6$, $NH_3$, $SiH_4$, $H_2O$, $N_2H_4$, $H_2O_2$, NO, $N_2O$, $H_2S$, $SO_3$, $SO_2$, $SO_2$, $H_2Se$, $H_2$, $B_2H_6$, $NH_2R$, and $NHR_2$, where R is organic or silylorgano.

According to a another aspect of the invention, a deposition method includes providing a deposition substrate, exposing the substrate to a precursor consisting of at least one amino ligand and/or imino ligand, a metal or a semimetal, and at least one halide ligand, and depositing over the substrate a layer including the metal, the semimetal, or an oxide, nitride, silicide, sulfide, or selenide of the metal or semimetal. The layer exhibits less halogen content than otherwise exhibited with a halide ligand taking the place of each amino ligand and/or imino ligand. By way of example, the precursor may exhibit a volatility that exceeds the volatility otherwise exhibited with a halide ligand taking the place of each amino ligand and/or imino ligand. The precursor may also exhibit a thermal stability that exceeds the thermal stability otherwise exhibited with an amino ligand and/or imino ligand taking the place of each halide ligand.

According to a further aspect of the invention, a deposition method includes providing a deposition substrate, exposing the substrate to a precursor consisting of at least one imino ligand, a metal or semimetal, and a least one halide ligand, and depositing over the substrate a layer including the metal, the semimetal, or an oxide, nitride, silicide, sulfide, or selenide of the metal or semimetal.

BRIEF DESCRIPTION OF THE DRAWINGS

Preferred embodiments of the invention are described below with reference to the following accompanying drawings.

FIG. 3 shows chemical structures of exemplary organometallic ligands.

DETAILED DESCRIPTION OF THE PREFERRED EMBODIMENTS

Figure 1:
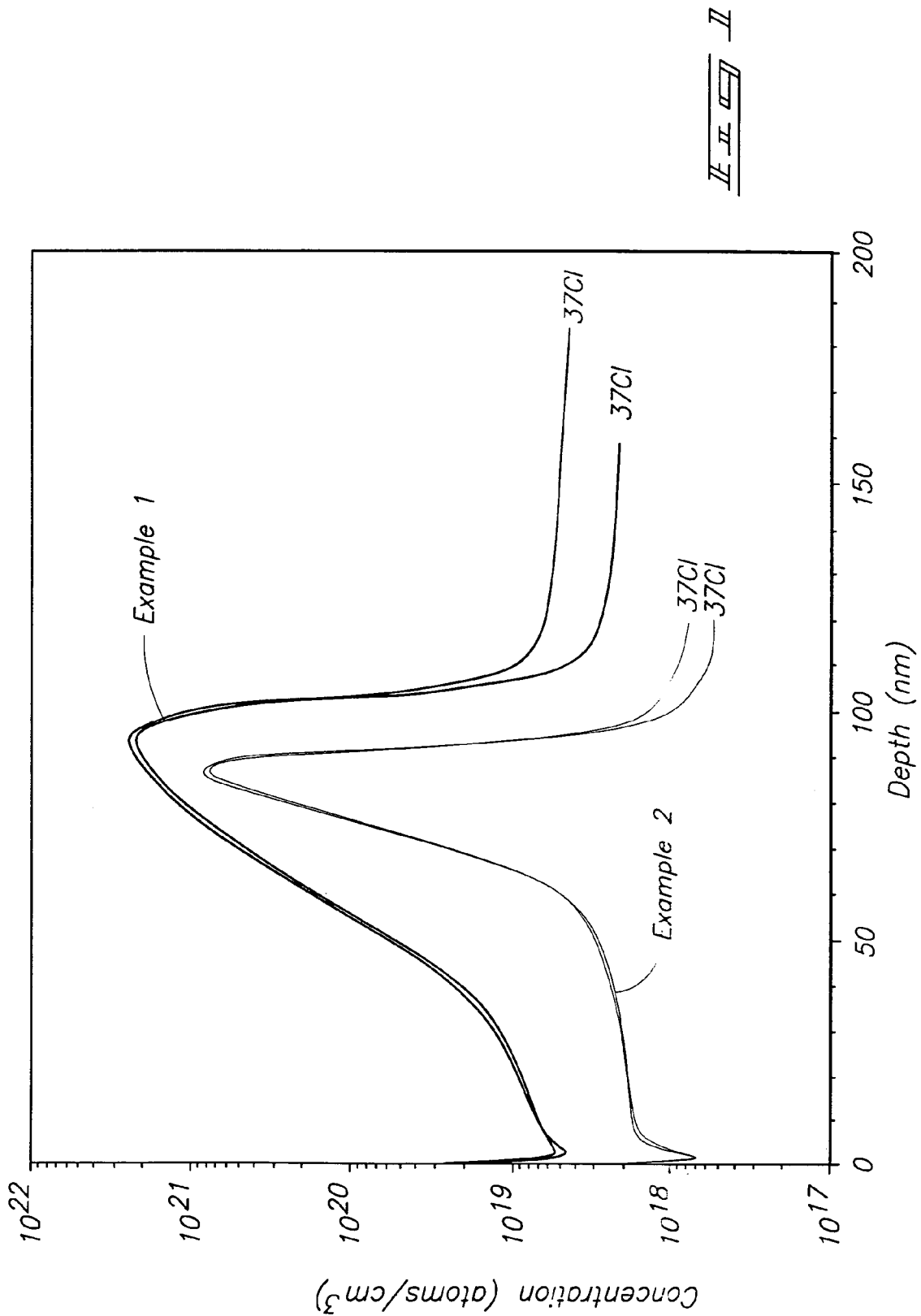
FIG. 1 is a chart of SIMS (secondary ion mass spectrometry) data for two TiN films deposited using $TiCl_3(NMe_2)$.

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), pulsed CVD, etc., but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Described in summary, ALD includes exposing an initial substrate to a first chemical precursor to accomplish chemisorption of the precursor onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first precursor is purged from over the substrate and a second chemical precursor is provided to react with the first monolayer of the first precursor. The second precursor is then purged and the steps are repeated with exposure of the deposited monolayer to the first precursor. In some cases, the two monolayers may be of the same precursor. As an option, the second precursor can react with the first precursor, but not chemisorb additional material thereto. As but one example, the second precursor can cleave some portion of the chemisorbed first precursor, altering such monolayer without forming another monolayer thereon. Also, a third precursor or more may be successively chemisorbed (or reacted) and purged just as described for the first and second precursors.

In the context of the present document, "reacting" or "reaction" refers to a change or transformation in which a substance decomposes, combines with other substances, or interchanges constituents with other substances. Thus, it will be appreciated that "chemisorbing" or "chemisorption" is a specific type of reacting or reaction that refers to taking up and chemically binding (a substance) onto the surface of another substance.

Purging may involve a variety of techniques including, but not limited to, contacting the substrate and/or monolayer with a carrier gas and/or lowering pressure to below the deposition pressure to reduce the concentration of a precursor contacting the substrate and/or chemisorbed precursor. Examples of carrier gases include $N_2$, Ar, He, etc. Purging may instead include contacting the substrate and/or monolayer with any substance that allows chemisorption byproducts to desorb and reduces the concentration of a contacting precursor preparatory to introducing another precursor. The contacting precursor may be reduced to some suitable concentration or partial pressure known to those skilled in the art as suitable based upon the specifications for the product of a particular deposition process.

ALD is often described as a self-limiting process, in that a finite number of sites exist on a substrate to which the first precursor may form chemical bonds. The second precursor might only bond to the first precursor and thus may also be self-limiting. Once all of the finite number of sites on a substrate is bonded with a first precursor, the first precursor will often not bond to other of the first precursor already bonded with the substrate. However, process conditions can be varied in ALD to promote such bonding and render the process not self-limiting. Accordingly, the process may also encompass a precursor forming other than one monolayer at a time by stacking of a precursor, forming a layer more than one atom or molecule thick. The various aspects of the present invention described herein are applicable to any circumstance where ALD may be desired. A few examples of materials that may be deposited by ALD include metals, metal oxides, metal nitrides, and others.

Typically, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple precursors in the deposition chamber that react to form the deposited material. Such condition is contrasted with the purging criteria for traditional ALD wherein a substrate is contacted with a single deposition precursor that chemisorbs to a substrate or reacts with a previously deposited precursor. An ALD process regime may provide a simultaneously contacted plurality of precursors of a type or under conditions such that ALD chemisorption, rather than CVD reaction occurs. Instead of reacting together, the plurality of precursors may chemisorb to a substrate or previously deposited precursor, providing a surface onto which subsequent precursors may next chemisorb or react to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed precursor. Other process conditions, for example pressure and temperature, may also influence chemisorption rate. In comparison to the predominantly thermally driven CVD, ALD is predominantly chemically driven. Accordingly, ALD is often conducted at much lower temperatures than CVD.

Surface reaction of the second precursor can occur at substantially the same temperature as chemisorption of the first precursor or, less preferably, at a substantially different temperature. Clearly, some small variation in temperature, as judged by those of ordinary skill, can occur but still be a substantially same temperature by providing a reaction rate statistically the same as would occur at the temperature of the first precursor chemisorption. Chemisorption and subsequent reactions could instead occur at exactly the same temperature.

Reactivity of a precursor can significantly influence the process parameters in ALD. Under typical CVD process conditions, a highly reactive compound may react in the gas phase generating particulates, depositing prematurely on undesired surfaces, producing poor films, and/or yielding poor step coverage or otherwise yielding non-uniform deposition. For at least such reason, a highly reactive compound might be considered not suitable for CVD. However, some heteroleptic compounds not suitable for CVD may be superior ALD precursors and vice versa, as described herein.

According to one aspect of the invention, an ALD method includes providing a deposition substrate and exposing the substrate to a first precursor including a metal or semimetal and a plurality of different ligands, chemisorbing a precursor monolayer on the substrate using the first precursor, and reacting a second precursor with the precursor monolayer. The method includes modifying the precursor monolayer and yielding a product monolayer consisting essentially of the metal, the semimetal, or an oxide, nitride, silicide, sulfide, or selenide of the metal or semimetal. A surface reactive ligand of the first precursor exhibits a chemisorption affinity for the substrate that exceeds the chemisorption affinity exhibited by a gas reactive ligand of the first precursor.

As may be appreciated from the described method, ALD commonly accomplishes deposition by means of at least two steps. First, a precursor monolayer is chemisorbed on a substrate using a first precursor. Next, a second precursor is reacted with the precursor monolayer. The specific reaction mechanism may vary depending upon the chemical properties of the first and second precursors and reaction conditions, but nevertheless bears the objective of finishing conversion of the chemisorbed precursor monolayer to a material of interest. ALD commonly accomplishes both steps with homoleptic precursors. However, it may be less optimal to use homoleptic precursors in some deposition processes.

The present method begins with a metal or a semimetal including a plurality of different ligands and yields a product monolayer consisting essentially of the metal, the semimetal, or an oxide, nitride, silicide, sulfide, or selenide of the metal or semimetal. Modifying the precursor monolayer may include desorbing extraneous ligands, organic portions of the precursor monolayer, etc. so as to obtain the desired product monolayer. Some desorbing of ligands, organic portions of the first precursor, etc., may instead or additionally occur during chemisorption of the precursor monolayer on the substrate using the first precursor. For example, it is conceivable that chemisorbing the precursor monolayer results in desorption of all undesired portions of the first precursor. Then, reacting the second precursor with the precursor monolayer and modifying the precursor monolayer involves mere addition of material without desorption of material remaining from the first precursor.

The heteroleptic first precursor described above may be advantageously used to tailor reactivity of the first precursor to a specific type of product monolayer, deposition substrate, etc. For example, a desire may exist for the first precursor to be highly reactive with a substrate to facilitate effective chemisorption. A highly reactive precursor may perform better in producing a saturated monolayer, especially when surface properties of the substrate may vary across its surface. By providing a plurality of different ligands, a surface reactive ligand exhibiting a chemisorption affinity for the substrate that exceeds the chemisorption affinity exhibited by the gas reactive ligand may provide the desired high reactivity.

The gas reactive ligand may provide a specific functionality different from the surface reactive ligand that may be used when reacting the second precursor with the precursor monolayer after chemisorption of the precursor monolayer. Accordingly, the gas reactive ligand of the first precursor may remain as a gas reactive ligand of the precursor monolayer after chemisorption of the precursor monolayer is complete. It may be further advantageous for reaction of the second precursor with the precursor monolayer specifically to include reacting the second precursor with the gas reactive ligand that remains with the precursor monolayer after completing chemisorption. As one example, the gas reactive ligand may exhibit a thermal stability that exceeds the thermal stability exhibited by the surface reactive ligand.

As may be appreciated, heteroleptic precursors provide opportunities for customizing ALD that do not exist with homoleptic precursors. A homoleptic first precursor that exhibits a desired functionality when chemisorbing a precursor monolayer, but exhibits a less than desirable performance when reacting a second precursor with the precursor monolayer might be modified. One or more ligand that does not perform well during the reacting step may be exchanged for a different ligand exhibiting a desired functionality. Also, a homoleptic first precursor that performs well when reacting a second precursor with the precursor monolayer, but does not perform well when chemisorbing a precursor monolayer may be modified. One or more ligand may be exchanged for an alternative ligand expected to perform well during the chemisorbing.

Even though a variety of heteroleptic precursors are known, no recognition exists of the opportunity for selecting ligands according to the principles described herein. In the aspects of the present invention, those of ordinary skill may identify one homoleptic precursor that performs well when chemisorbing the precursor monolayer and another homoleptic precursor that performs well when reacting a second precursor with the precursor monolayer. Then, using the ligands from the two homoleptic precursors, they may design a custom heteroleptic precursor that possesses multiple desirable, but different, functionalities.

By way of example, the principles described above may be demonstrated through ALD of a metal oxide. Processing temperatures that are relatively high for ALD processes may be desired to promote deposition in a dense or crystalline morphology indicating a desire for ligands with a high thermal stability. Even so, a desire may exist for the ALD precursor to be highly reactive with surfaces of the deposition substrate to facilitate effective chemisorption. It may be difficult, if not impossible, to identify a homoleptic precursor of the desired metal oxide that satisfies the described functionalities. Also, little or no guidance exists in the art as to how or why a heteroleptic precursor may be advantageous in resolving the stated problem.

According to the principles described herein, a first precursor may be used that includes a plurality of different ligands, such as a surface reactive ligand that exhibits a high chemisorption affinity and a gas reactive ligand that exhibits a high thermal stability. In this manner, all of the desired functionalities for the precursor may be provided. One possible example includes bis(tert-butoxy) bis(dimethylhexanedionato)hafnium ($Hf(OBu^t)_2(dmhd)_2$, where $Bu^t$ is tert-butyl), where the surface reactive ligand is tert-butoxy and the gas reactive ligand is dimethylhexanedionato. The tert-butoxy groups of such a precursor are very basic and may react easily with acidic groups (typically hydrogen) on a surface of a substrate. The dimethylhexanedionato groups are less reactive with the substrate and may require strong oxidizers, such as ozone to be removed. The dimethylhexanedionato groups are also more thermally stable than the tert-butoxy groups so that relatively higher process temperatures during ALD do not result in thermal decomposition of a chemisorbed precursor monolayer and interfere with ALD. Another possible example includes trichloro(diethylamino) titanium (IV), where the surface reactive ligand is diethylamino and the gas reactive ligand is chloride.

Hf(OBu$^t$)$_2$(dmhd)$_2$ may be considered a substitute for Hf(NMe$_2$)$_4$ which is a hydrolysis sensitive precursor readily chemisorbed on some surfaces (especially hydroxylated surfaces). Unfortunately, for long exposure times to a heated surface Hf(NMe$_2$)$_4$ may be too reactive with adventitious moisture or thermally unstable at desired deposition temperatures. As a result of thermal instability, ALD using Hf(NMe$_2$)$_4$ becomes difficult above 250° C., particularly in furnace processes where exposure times need to be relatively long to complete surface saturation. Replacement of one or more NMe$_2$ groups with an equal number of tert-butoxy groups provides ligands reactive with surface hydroxyls in a kinetically favorable reaction. Replacement of one or more NMe$_2$ groups with an equal number of dmhd groups provides ligands less susceptible to hydrolysis and thermal decomposition during chemisorption of the precursor monolayer. The dmhd thus adds stability to the precursor monolayer until the second precursor, such as a reactive gas, is introduced to form HfO$_2$.

A list of exemplary ligands includes amino, imino, halide, pseudohalide, diketonate, alkoxide, ketoiminate, amidinate, carboxylate, cyclopentadienyl, hydrido, alkyl, and a neutral ligand. Some of such ligands may have previously been identified as possible ligands in homoleptic or heteroleptic precursors. However, ketoiminate and amidinate ligands are herein identified as ligands of particular interest not previously widely used that may be combined with other ligands described herein and known to those of ordinary skill to accomplish the present aspects of the invention. FIGS. 3(a) to 3(g) respectively provide exemplary structural formulas, without limitation, for diketonate, ketoiminate, alkoxide, dialkylamino, carboxylate, amidinate, and cyclopentadienyl ligands.

Amines and imines are also of interest. Accordingly, the surface or gas reactive ligand may consist of NR$_2$ and/or NR, where R is H, alkyl, aryl, or silyl. Amino and imino ligands preferably include, respectively, dialkylamino and alkylimino ligands. Pseudohalide ligands may include cyanate, thiocyanate, thiosulfate, azide, hydroxide, hydride, phenyl, etc. anions that resemble halides in their acid-base and oxidation-reduction chemistry. The neutral ligand may include alkene, diene, cyclic diene (such as cyclopentadienyl), triene, alkyne, CO, and NO ligands. Even though neutral ligands may be effective in meeting the present objectives, a preference exists that both the surface and gas reactive ligands are anionic. Also, observation indicates that the first precursor may preferably be ionically neutral since organometallic complex cations or anions as precursors may be less volatile and, thus, more difficult to use in ALD processes.

A variety of metals or semimetals may be selected for the first precursor. In the context of the present document, "semimetal" refers to boron, silicon, arsenic, selenium, tellurium, and astatine. Accordingly, the group of elements included within the expression "metal or semimetal" includes all of the elements of the Period Table except for hydrogen, carbon, nitrogen, oxygen, phosphorus, sulfur, fluorine, chlorine, bromine, iodine, and the noble gases. Metals are more preferred and more commonly of interest in ALD. Of such elements, a few elements exhibiting valences of 4, 5, or 6 may have particularly useful application in ALD for semiconductor devices and consist of titanium, zirconium, hafnium, vanadium, niobium, tantalum, chromium, molybdenum, and tungsten.

A list of exemplary second precursors that may be used in reacting the second precursor with the precursor monolayer includes at least one of O$_2$, O$_3$, Si$_2$H$_6$, NH$_3$, SiH$_4$, H$_2$O, N$_2$H$_4$, H$_2$O$_2$, NO, N$_2$O, H$_2$S, SO$_3$, SO$_2$, H$_2$Se, H$_2$, B$_2$H$_6$, NH$_2$R, and NHR$_2$, where R is organic or silylorgano. One example of possible substrates includes a bulk semiconductor wafer. The product monolayer is described as consisting essentially of the metal, the semimetal, or an oxide, nitride, silicide, sulfide, or selenide of the metal or semimetal so as to indicate inclusion in the product monolayer of the specified materials and those that do not materially affect the basic and novel characteristics of the product monolayer.

Alternatively, the product monolayer may consist of the metal, the semimetal, or an oxide, nitride, silicide, sulfide, or selenide of the metal or semimetal along with any ligand contaminants. That is, the product monolayer might not include materials other than those recited except for impurities ordinarily associated therewith. Depending upon the precursors selected and processing conditions, it is conceivable that low levels of contaminants, such as halides, may be included in the product monolayer. Any contaminants, such as halides, organic material, etc. normally resulting from conventional ALD processes are included in the list of possible product monolayer contaminants.

In another aspect of the invention, an ALD method includes providing a deposition substrate and exposing the substrate to an ionically neutral first precursor in the substantial absence of a second precursor and chemisorbing a precursor monolayer on the substrate using the first precursor. The first precursor includes a metal and a plurality of different ligands. A surface reactive ligand of the first precursor exhibits a chemisorption affinity for the substrate that exceeds the chemisorption affinity exhibited by a gas reactive ligand of the first precursor. The plurality of ligands includes ketoiminate and/or amidinate. The gas reactive ligand of the first precursor exhibits a thermal stability that exceeds the thermal stability exhibited by the surface reactive ligand and the gas reactive ligand remains as a gas reactive ligand of the precursor monolayer after the chemisorbing. The method includes reacting the second precursor with the gas reactive ligand of the precursor monolayer in the substantial absence of any first precursor vapor, modifying the precursor monolayer, and yielding a product monolayer consisting essentially of the metal or an oxide, nitride, silicide, sulfide, or selenide of the metal. The second precursor includes at least one of O$_2$, O$_3$, Si$_2$H$_6$, NH$_3$, SiH$_4$, H$_2$O, N$_2$H$_4$, H$_2$O$_2$, NO, N$_2$O, H$_2$S, SO$_3$, SO$_2$, H$_2$Se, H$_2$, B$_2$H$_6$, NH$_2$R, and NHR$_2$, where R is organic or silylorgano.

The described method indicates the "substantial absence" of the second precursor during chemisorption of the first precursor since insignificant amounts of the second precursor might be present. According to the knowledge and the preferences of those with ordinary skill in the art, a determination can be made as to the tolerable amount of second precursor and process conditions selected to achieve the substantial absence of the second precursor. Similar considerations apply to ensuring the substantial absence of any first precursor vapor during reaction of the second precursor with the chemisorbed precursor monolayer.

The described ALD methods may be conducted at a temperature of from about 0 to about 600° C. or preferably from about 100 to about 400° C. A pressure for the deposition methods may be from about $1\times10^{-7}$ to 760 Torr or preferably from about $1\times10^{-3}$ to about 10 Torr.

Even though the advantages of heteroleptic precursors obtained by the methods described above apply to ALD, additional or different advantages may be obtained in other deposition methods, such as CVD, using heteroleptic precursors. Often, process temperature during CVD exceeds conventional process temperatures for ALD. In thermally driven CVD methods precursor ligands typically thermally decompose throughout the deposition process. Thus, the specific functionalities of heteroleptic precursors described herein as advantageous in chemically driven ALD are generally much less significant. Even so, heteroleptic precursors may exhibit previously unrecognized advantages over homoleptic precursors such as volatility, thermal stability, etc. that may be relied upon to improve deposition methods, in general, and CVD, specifically.

According to a further aspect of the invention, a deposition method includes providing a deposition substrate, exposing the substrate to a precursor consisting of at least one amino ligand and/or imino ligand, a metal or a semimetal, and at least one halide ligand, and depositing over the substrate a layer including the metal, the semimetal, or an oxide, nitride, silicide, sulfide, or selenide of the metal or semimetal. The layer exhibits less halogen content than otherwise exhibited with a halide ligand taking the place of each amino ligand and/or imino ligand. By way of example, the precursor may exhibit a volatility that exceeds the volatility otherwise exhibited with a halide ligand taking the place of each amino ligand and/or imino ligand. The precursor may also exhibit a thermal stability that exceeds the thermal stability otherwise exhibited with an amino ligand and/or imino ligand taking the place of each halide ligand.

A comparison was made between precursors such as described above with titanium for the metal and significant advantages were discovered. For example, titanium nitride films were deposited by ALD using $TiCl_4$, tetrakisdimethylamino titanium (TDMAT), and trichloro(dimethylamino) titanium ($TiCl_3(NMe_2)$). Titanium nitride films deposited from the halide amino metal were found to exhibit resistivities of about 150 to 200 microOhm-centimeter while films deposited from TDMAT were much more resistive with resistivities of from about 5,000 to about 50,000 microOhm-centimeter. The films from halide amino metal were also found to exhibit lower concentrations of chlorine in the film compared to those deposited using $TiCl_4$. Examples 1-4 discussed below provide details of the deposition processes and resulting films.

Further, the halide amino metal deposited titanium nitride films at much lower temperatures than $TiCl_4$. Since a lower deposition temperature was suitable, the deposition process may be less damaging to underlying materials, such as a dielectric when titanium nitride is used as a top electrode in metal-insulator-metal applications. The halide amino metal exhibited suitable volatility even though it is less volatile in comparison to $TiCl_4$. Generally, a vapor pressure of greater than 0.1 Torr at less than or equal to 120° C. is suitable. Trichloro(dimethylamino)titanium exhibits a vapor pressure of about 2 Torr at 100° C. Even though the examples provided herein used trichloro(dimethylamino)titanium (IV), additional testing revealed a preference for trichloro (diethylamino)titanium (IV) as being more thermally stable and having a higher vapor pressure of about 0.28 Torr at 75° C.

Demonstration of other advantages of the indicated method may be appreciated by reference to another specific example. $HfCl_4$ and $Hf(NMe_2)_4$ both constitute conventional homoleptic precursors used in deposition of hafnium, hafnium oxide, and hafnium nitride. High K low leakage hafnium oxide has been deposited from $HfCl_4$ in ALD processes by using higher temperatures than typical ALD. While $HfCl_4$ is more thermally stable than $Hf(NMe_2)_4$, it is less volatile than $Hf(NMe_2)_4$. In addition, hafnium oxide deposited from $HfCl_4$ exhibits higher halogen content than desired. Accordingly, $HfCl_4$ is thermally stable in the indicated process, but a more volatile precursor is sought that does not contribute to halogen contamination. $Hf(NMe_2)_4$ does not contribute to halogen contamination and exhibits sufficient volatility, but it is not thermally stable enough to effectively deposit hafnium oxide at the desired higher temperatures.

In keeping with the aspects of the present invention, trichloro(dimethylamino)hafnium ($HfCl_3(NMe_2)$), a heteroleptic precursor, may be used instead. Trichloro(dimethylamino)hafnium exhibits a higher volatility and has a lower melting point in comparison to $HfCl_4$ and exhibits a greater thermal stability in comparison to $Hf(NMe_2)_4$. For these reasons, $HfCl_3(NMe_2)$ is more effectively delivered in the deposition process. Trichloro(dimethylamino)hafnium also contributes less halogen contamination than $HfCl_4$ due to substitution of one of the chloride ligands with a dimethylamino ligand. Further, even though the advantages of $HfCl_3(NMe_2)$ were recognized in the context of an ALD process, the advantages of increased volatility, lower melting point, increased thermal stability, and decreased halogen content may also be applicable to CVD. The advantages may also apply to other deposition methods that use a precursor consisting of at least one amino ligand and/or imino ligand, a metal or a semimetal, and at least one halide ligand.

Accordingly, the deposition method described above may be ALD and depositing the layer may include chemisorbing a precursor monolayer on the substrate using the precursor, reacting a second precursor with the precursor monolayer, modifying the precursor monolayer, and yielding the layer as a product monolayer. Instead, the deposition method may be CVD and exposing the substrate to the precursor may include simultaneously exposing the substrate to a second precursor. Depositing the layer may include continuously reacting the precursor with the second precursor throughout the deposition and forming the layer from the reaction product. The reaction product may include the metal, the semimetal, or the oxide, nitride, silicide, sulfide, or selenide of the metal or semimetal.

The precursor may consist of a halide amino metal. The precursor may be ionically neutral and consist of $X_{z-y}M(NR_2)_y$, where X is halogen, M is metal, z is the valence of M, R is alkyl, aryl, or silyl, and y is at least 1. Also, z may be 4, 5, or 6 and y may be 1 to 5. Instead, the precursor may consist of a halide imino metal. The precursor may be ionically neutral and consist of $X_{z-y}M(NR)_y$, where X is halogen, M is metal, z is the valence of M, R is alkyl, aryl, or silyl, and y is at least 1. Also, z may be 4, 5, or 6 and y may be 1 to 5.

Some or all of the advantages of a deposition method obtained for trichloro(dimethylamino)hafnium are expected for deposition methods using halide amino metals of, in particular, other tetravalent metals. Accordingly, the precursor may be selected from the group consisting of trichloro (dimethylamino)hafnium, trichloro(dimethylamino)titanium (IV), trichloro(dimethylamino)zirconium (IV), trichloro(diethylamino)hafnium, trichloro(diethylamino)titanium (IV), and trichloro(diethylamino)zirconium (IV). Other metals of interest include vanadium, niobium, tantalum, chromium, molybdenum, and tungsten.

Although the advantages of the aspects of the invention may be obtained for both amino and imino ligands, a particular interest exists with regard to imino ligands given their previously unrecognized use in metal or semimetal complexes with halide ligands. According to a still further aspect of the invention, a deposition method includes providing a deposition substrate, exposing the substrate to a precursor consisting of at least one imino ligand, a metal or semimetal, and a least one halide ligand, and depositing over the substrate a layer including the metal, the semimetal, or an oxide, nitride, silicide, sulfide, or selenide of the metal or semimetal.

For ALD, the deposition methods in the present aspects of the invention may be performed, for example, at temperatures of from about 100 to about 500° C. or preferably from about 150 to about 400° C. and at a pressure of from about $1\times10^{-4}$ to about 10 Torr or preferably from about $1\times10^{-3}$ to about 5 Torr. A carrier gas of helium, argon, $N_2$, etc. may be provided with the precursor at a flow rate of from about 0 to about 2000 standard cubic centimeters per minute (sccm). When using trichloro(diethylamino)titanium, temperature may be from about 300 to about 340° C. When using dichloro bis(diethylamino)titanium as a precursor temperature may be from about 250 to about 350° C.

For CVD processes, a pressure of from about $1\times10^{-4}$ to about 1000 Torr or preferably from about $1\times10^{-3}$ to about 5 Torr may be used. A temperature of from about 100 to about 800° C. or preferably from about 200 to about 600° C. may be used. A carrier gas of helium, argon, $N_2$, etc. may be used at a flow rate of from about 0 to about 2000 sccm.

EXAMPLE 1

Figure 2:
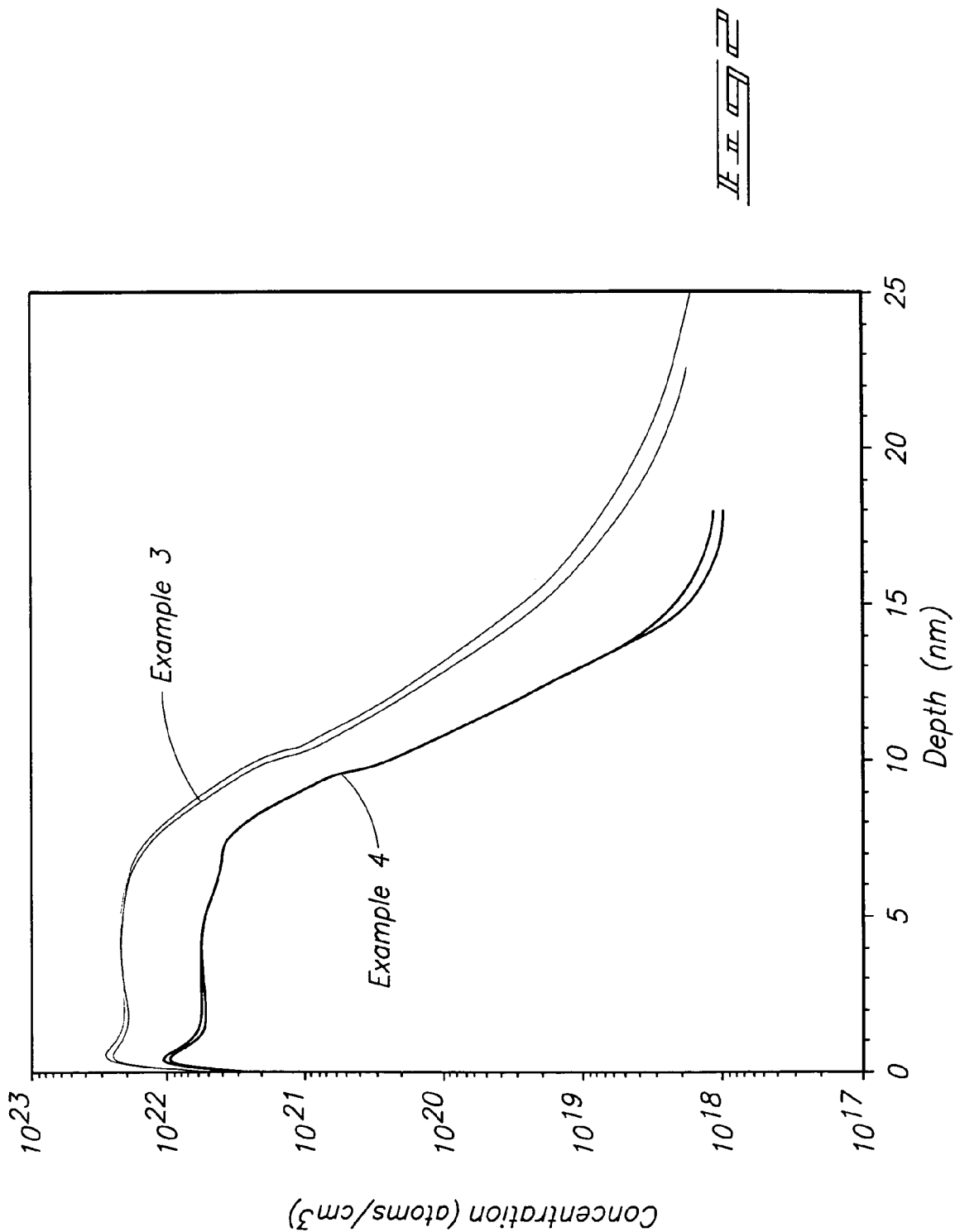
FIG. 2 is a chart of SIMS data for two TiN films deposited using $TiCl_4$.

A Ti precursor monolayer was chemisorbed to a silicon substrate maintained at 295° C. by flowing 10 sccm of He carrier gas across liquid $TiCl_3(NMe_2)$ maintained at 73° C. and into a deposition chamber maintained at 0.01 Torr. The $TiCl_3(NMe_2)$ was pulsed into the deposition chamber for 2.0 seconds (sec) followed by 2 sec of Ar purge gas flowing at 200 sccm. $NH_3$ was reacted with the precursor monolayer to form a TiN monolayer by flowing 100 sccm of $NH_3$ into the deposition chamber for 1 sec followed by 3 sec of Ar purge gas flowing at 200 sccm. The $TiCl_3(NMe_2)$/purge/$NH_3$/purge cycle was repeated until a 100 nanometer (nm) layer was formed. SIMS analysis for chlorine produced the depth profile shown by the top line in FIG. 1. The "37Cl" notation in FIG. 1 indicates that the analysis occurred for the 37 atomic mass unit isotope of chlorine. Even though FIG. 1 shows a spike in Cl concentration from about 40 to about 100 nm, the spike does not reach the higher level shown in FIG. 2 for ALD using $TiCl_4$ and overall Cl concentration is much lower.

EXAMPLE 2

Example 1 was repeated at a substrate temperature of 347° C. to form a 90 nm TiN layer. SIMS analysis for chlorine produced the depth profile shown by the bottom line in FIG. 1. Even though FIG. 1 shows a spike in Cl concentration from about 60 to about 100 nm, the spike does not reach the higher level shown in FIG. 2 for ALD using $TiCl_4$ and overall Cl concentration is much lower.

EXAMPLE 3

A Ti precursor monolayer was chemisorbed to a silicon substrate maintained at 450° C. by flowing a carrier gas across liquid $TiCl_4$ and into a diffusion furnace deposition chamber. The $TiCl_4$ was pulsed into the deposition chamber followed by purge gas. $NH_3$ was reacted with the precursor monolayer to form a TiN monolayer by flowing $NH_3$ into the deposition chamber followed by purge gas. The $TiCl_4$/purge/$NH_3$/purge cycle was repeated until a 10 nanometer (nm) layer was formed. SIMS analysis for chlorine produced the depth profile shown by the top line in FIG. 2.

EXAMPLE 4

A Ti precursor monolayer was chemisorbed to a silicon substrate maintained at 600° C. by flowing a carrier gas across liquid $TiCl_4$ and into a single wafer deposition chamber. The $TiCl_4$ was pulsed into the deposition chamber followed by purge gas. $NH_3$ was reacted with the precursor monolayer to form a TiN monolayer by flowing $NH_3$ into the deposition chamber followed by purge gas. The $TiCl_4$/purge/$NH_3$/purge cycle was repeated until a 10 nanometer (nm) layer was formed. SIMS analysis for chlorine produced the depth profile shown by the bottom line in FIG. 2.

EXAMPLE 5

A borophosphosilicate glass (BPSG) surface of a substrate maintained at 300° C. in a deposition chamber at $10^{-3}$ Torr was exposed to $Hf(OBu^t)_2(dmhd)_2$ heteroleptic precursor vapor from a reservoir held at 112° C. using only the vapor pressure of the precursor to maintain flow. Every 20 sec, the precursor flow was stopped and 50 sccm of $N_2$ purge gas flowed across the substrate for 1 sec to remove any reaction byproducts until a total precursor exposure time of 4000 sec was reached. Since no oxidizer or reaction gas was used, any deposited film would result only from thermal decomposition. After processing, high resolution scanning electron microscope (SEM) inspection and AES revealed no measurable film thickness and only a trace of discontinuous Hf on the surface. The deposition process was repeated at 225° C. at otherwise identical conditions using $Hf(NMe_2)_4$, $Hf(NEtMe)_4$ (where Et represents $C_2H_5$), and $Hf(OBu^t)_4$ homoleptic precursor vapors. For each case, the precursor deposited a film in a thickness range of 160 to 220 Angstroms. This example demonstrates the relative thermal stability of the heteroleptic precursor.

EXAMPLE 6

Figure 4:
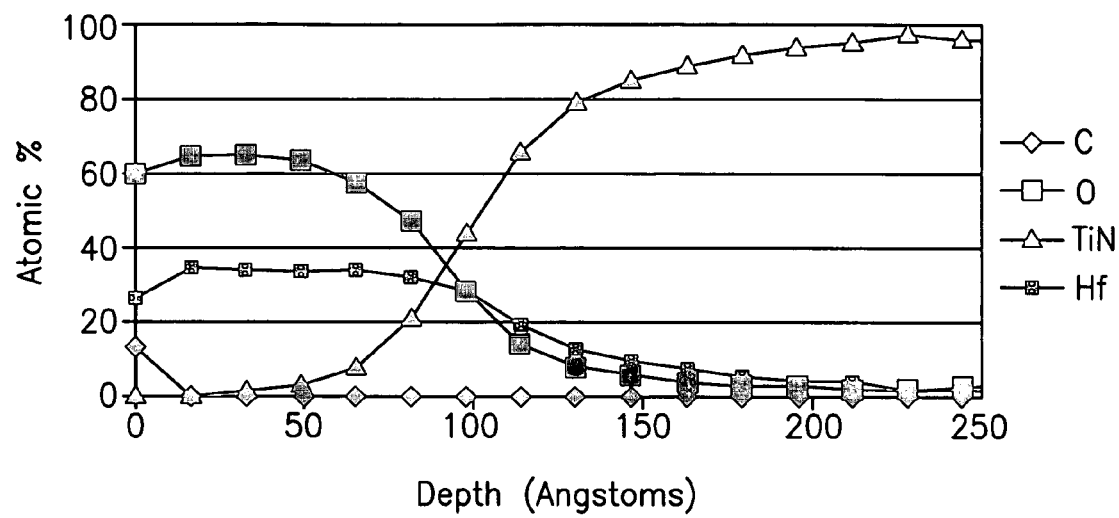
FIG. 4 is a chart of AES (atomic emission spectroscopy) data for a $HfO_2$ film deposited according to an aspect of the invention using $Hf(OBu^t)_2(dmhd)_2$.

A Hf precursor monolayer was chemisorbed to a titanium nitride surface of a substrate maintained at 300° C. by flowing 10 sccm of He carrier gas through a reservoir of $Hf(OBu^t)_2(dmhd)_2$ maintained at 92° C. and into a deposition chamber maintained at $10^{-4}$ Torr. The $Hf(OBu^t)_2(dmhd)_2$ was pulsed into the deposition chamber for 1 sec followed by 2 sec of $N_2$ purge gas flowing at 100 sccm. A mixed $O_2/O_3$ reaction gas with approximately 11% $O_3$ by weight was reacted with the precursor monolayer to form a hafnium oxide monolayer by flowing 10 sccm of reaction gas into the deposition chamber for 1 sec followed by 2 sec of $N_2$ purge gas flowing at 100 sccm. The ALD deposit/purge/react/purge cycle was repeated until a 100 Angstrom layer was formed. AES produced the depth profile shown in FIG. 4, revealing a carbon-free layer of near stoichiometric $HfO_2$.

EXAMPLE 7

Figure 5:
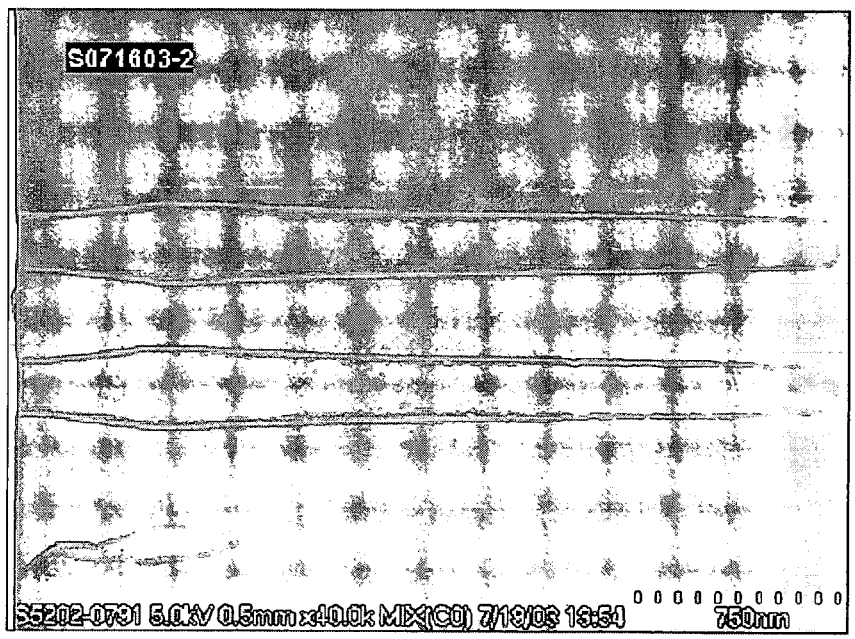
FIG. 5 is a SEM (scanning electron microscope) photomicrograph of a $HfO_2$ film deposited according to an aspect of the invention in cylindrical holes.

Example 6 was repeated for a BPSG surface of a substrate having 15:1 aspect ratio cylindrical holes formed therein. Conformal, near 100% step coverage of a 60 Angstrom film was obtained for the aggressive surface feature and is shown in the cross-sectional SEM photomicrograph of FIG. 5. Example 6 was repeated using homoleptic precursors $Hf(NMe_2)_4$, $Hf(NEtMe)_4$, and $Hf(OBu^t)_4$. The other precursors yielded very poor step coverage apparently due to precursor thermal decomposition preferentially on the top surfaces of the substrate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An ALD method comprising:
   providing a deposition substrate and exposing the substrate to a first precursor including a metal or a semimetal and a plurality of different ligands, a surface reactive ligand of the first precursor exhibiting a chemisorption affinity for the substrate that exceeds the chemisorption affinity exhibited by a gas reactive ligand of the first precursor;
   chemisorbing a precursor monolayer on the substrate using the first precursor;
   reacting a second precursor with the precursor monolayer, modifying the precursor monolayer, and yielding a product monolayer consisting essentially of the metal, the semimetal, or an oxide, nitride, silicide, sulfide, or selenide of the metal or semimetal.

2. The method of claim 1 wherein the gas reactive ligand of the first precursor remains as a gas reactive ligand of the precursor monolayer after the chemisorbing.

3. The method of claim 2 wherein reacting the second precursor with the precursor monolayer comprises reacting the second precursor with the gas reactive ligand.

4. The method of claim 1 wherein the gas reactive ligand exhibits a thermal stability that exceeds the thermal stability exhibited by the surface reactive ligand.

5. The method of claim 1 wherein the plurality of ligands comprises ketoiminate and/or amidinate.

6. The method of claim 1 wherein the second precursor consists of at least one of $O_2$, $O_3$, $Si_2H_6$, $NH_3$, $SiH_4$, $H_2O$, $N_2H_4$, $H_2O_2$, NO, $N_2O$, $H_2S$, $SO_3$, $SO_2$, $H_2Se$, $H_2$, $B_2H_6$, $NH_2R$, and $NHR_2$, where R is organic or silylorgano.

7. An ALD method comprising:
   providing a deposition substrate and exposing the substrate to a first precursor including a metal or a semimetal and a plurality of different ligands, a surface reactive ligand of the first precursor exhibiting a chemisorption affinity for the substrate that exceeds the chemisorption affinity exhibited by a gas reactive ligand of the first precursor;
   chemisorbing a precursor monolayer on the substrate using the first precursor, the gas reactive ligand of the first precursor exhibiting a thermal stability that exceeds the thermal stability exhibited by the surface reactive ligand and the gas reactive ligand remaining as a gas reactive ligand of the precursor monolayer after the chemisorbing; and
   reacting a second precursor with the gas reactive ligand of the precursor monolayer, modifying the precursor monolayer, and yielding a product monolayer consisting essentially of the metal, the semimetal, or an oxide, nitride, silicide, sulfide, or selenide of the metal or semimetal.

8. The method of claim 7 wherein exposing the substrate to the first precursor occurs in the substantial absence of the second precursor and reacting the second precursor with the precursor monolayer occurs in the substantial absence of any first precursor vapor.

9. The method of claim 7 wherein the surface or gas reactive ligand consists of $NR_2$ and/or NR, where R is H, alkyl, aryl, or silyl.

10. The method of claim 7 wherein both the surface and gas reactive ligands are anionic.

11. The method of claim 7 wherein the first precursor is ionically neutral.

12. The method of claim 7 wherein the plurality of ligands consists of at least two of the following ligands: amino, imino, halide, pseudohalide, diketonate, alkoxide, ketoiminate, amidinate, carboxylate, cyclopentadienyl, hydrido, alkyl, and a neutral ligand.

13. The method of claim 12 wherein the amino and imino ligands comprise, respectively, dialkylamino and alkylimino ligands.

14. The method of claim 12 wherein the neutral ligand comprises alkene, diene, cyclic diene, triene, alkyne, CO, and NO ligands.

15. The method of claim 7 wherein the first precursor comprises bis(tert-butoxy) bis(dimethylhexanedionato) hafnium, the surface reactive ligand is tert-butoxy, and the gas reactive ligand is dimethylhexanedionato.

16. The method of claim 7 wherein the metal or semimetal is selected from the group consisting of titanium, zirconium, hafnium, vanadium, niobium, tantalum, chromium, molybdenum, and tungsten.

17. The method of claim 7 wherein the second precursor comprises at least one of $O_2$, $O_3$, $Si_2H_6$, $NH_3$, $SiH_4$, $H_2O$, $N_2H_4$, $H_2O_2$, NO, $N_2O$, $H_2S$, $SO_3$, $SO_2$, $H_2Se$, $H_2$, $B_2H_6$, $NH_2R$, and $NHR_2$, where R is organic or silylorgano.

18. The method of claim 7 wherein the substrate comprises a bulk semiconductor wafer.

19. An ALD method comprising:
   providing a deposition substrate and exposing the substrate to an ionically neutral first precursor in the substantial absence of a second precursor, the first precursor including a metal and a plurality of different ligands, a surface reactive ligand of the first precursor exhibiting a chemisorption affinity for the substrate that exceeds the chemisorption affinity exhibited by a gas reactive ligand of the first precursor, and the plurality of ligands including ketoiminate and/or amidinate;
   chemisorbing a precursor monolayer on the substrate using the first precursor, the gas reactive ligand of the first precursor exhibiting a thermal stability that exceeds the thermal stability exhibited by the surface reactive ligand and the gas reactive ligand remaining as a gas reactive ligand of the precursor monolayer after the chemisorbing; and
   reacting the second precursor with the gas reactive ligand of the precursor monolayer in the substantial absence of any first precursor vapor, modifying the precursor monolayer, and yielding a product monolayer consisting essentially of the metal or an oxide, nitride, silicide, sulfide, or selenide of the metal, the second precursor including at least one of $O_2$, $O_3$, $Si_2H_6$, $NH_3$, $SiH_4$, $H_2O$, $N_2H_4$, $H_2O_2$, NO, $N_2O$, $H_2S$, $SO_3$, $SO_2$, $H_2Se$, $H_2$, $B_2H_6$, $NH_2R$, and $NHR_2$, where R is organic or silylorgano.

20. A deposition method comprising:
providing a deposition substrate;
exposing the substrate to a precursor consisting of at least one amino ligand and/or imino ligand, a metal or a semimetal, and at least one halide ligand; and
depositing over the substrate a layer including the metal, the semimetal, or an oxide, nitride, silicide, sulfide, or selenide of the metal or semimetal, the layer exhibiting less halogen content than otherwise exhibited with a halide ligand taking the place of each amino ligand and/or imino ligand.

21. The method of claim 20 wherein the precursor exhibits a volatility that exceeds the volatility otherwise exhibited with a halide ligand taking the place of each amino ligand and/or imino ligand.

22. The method of claim 20 wherein the precursor exhibits a vapor pressure of greater than 0.1 Torr at less than or equal to 120° C.

23. The method of claim 20 wherein the precursor exhibits a thermal stability that exceeds the thermal stability otherwise exhibited with an amino ligand and/or imino ligand taking the place of each halide ligand.

24. The method of claim 20 wherein the precursor consists of a halide amino metal.

25. The method of claim 20 wherein the precursor is ionically neutral and consists of $X_{z-y}M(NR_2)_y$, where X is halogen, M is metal, z is the valence of M, R is alkyl, aryl, or silyl, and y is at least 1.

26. The method of claim 25 wherein z is 4, 5, or 6 and y is 1 to 5.

27. The method of claim 20 wherein the precursor consists of a halide imino metal.

28. The method of claim 20 wherein the precursor is ionically neutral and consists of $X_{z-y}M(NR)_y$, where X is halogen, M is metal, z is the valence of M, R is alkyl, aryl, or silyl, and y is at least 1.

29. The method of claim 28 wherein z is 4, 5, or 6 and y is 1 to 5.

30. The method of claim 20 wherein the amino and imino ligands comprise, respectively, dialkylamino and alkylimino ligands.

31. The method of claim 20 wherein the metal or semimetal is selected from the group consisting of titanium, zirconium, hafnium, vanadium, niobium, tantalum, chromium, molybdenum, and tungsten.

32. The method of claim 20 wherein the precursor is selected from the group consisting of trichloro(dimethylamino)hafnium, trichloro(dimethylamino)titanium (IV), trichloro(dimethylamino)zirconium (IV), trichloro(diethylamino) hafnium, trichloro(diethylamino)titanium (IV), and trichloro (diethylamino)zirconium (IV).

33. The method of claim 20 wherein the deposition method is ALD and depositing the layer comprises chemisorbing a precursor monolayer on the substrate using the precursor, reacting a second precursor with the precursor monolayer, modifying the precursor monolayer, and yielding the layer as a product monolayer.

34. The method of claim 20 wherein the deposition method is CVD, exposing the substrate to the precursor comprises simultaneously exposing the substrate to a second precursor, and depositing the layer comprises continuously reacting the precursor with the second precursor throughout the deposition, a product of the reaction including the metal, the semimetal, or the oxide, nitride, silicide, sulfide, or selenide of the metal or semimetal, and forming the layer from the reaction product.

35. The method of claim 20 wherein the substrate comprises a bulk semiconductor wafer.

36. A deposition method comprising:
providing a deposition substrate;
exposing the substrate to a precursor consisting of at least one imino ligand, a metal or a semimetal, and at least one halide ligand; and
depositing over the substrate a layer including the metal, the semimetal, or an oxide, nitride, silicide, sulfide, or selenide of the metal or semimetal.

37. The method of claim 36 wherein the layer exhibits less halogen content than otherwise exhibited with a halide ligand taking the place of each imino ligand.

38. The method of claim 36 wherein the precursor exhibits a vapor pressure of greater than 0.1 Torr at less than or equal to 120° C.

39. The method of claim 36 wherein the deposition method is ALD and depositing the layer comprises chemisorbing a precursor monolayer on the substrate using the precursor, reacting a second precursor with the precursor monolayer, modifying the precursor monolayer, and yielding the layer as a product monolayer.

40. The method of claim 36 wherein the precursor is ionically neutral and consists of $X_{z-y}M(NR)_y$, where X is halogen, M is metal, z is the valence of M, R is alkyl, aryl, or silyl, and y is at least 1.

41. The method of claim 40 wherein z is 4, 5, or 6 and y is 1 to 5.

42. The method of claim 36 wherein the imino ligand comprises an alkylimino ligand.

43. The method of claim 36 wherein the metal or semimetal is selected from the group consisting of titanium, zirconium, hafnium, vanadium, niobium, tantalum, chromium, molybdenum, and tungsten.

44. The method of claim 36 wherein the deposition method is CVD, exposing the substrate to the precursor comprises simultaneously exposing the substrate to a second precursor, and depositing the layer comprises continuously reacting the precursor with the second precursor throughout the deposition, a product of the reaction including the metal, the semimetal, or the oxide, nitride, silicide, sulfide, or selenide of the metal or semimetal, and forming the layer from the reaction product.

45. The method of claim 36 wherein the substrate comprises a bulk semiconductor wafer.

* * * * *

UNITED STATES PATENT AND TRADEMARK OFFICE
CERTIFICATE OF CORRECTION

PATENT NO. : 7,250,367 B2 Page 1 of 1
APPLICATION NO. : 10/932149
DATED : July 31, 2007
INVENTOR(S) : Vaartstra et al.

It is certified that error appears in the above-identified patent and that said Letters Patent is hereby corrected as shown below:

On the title page, item (56), under "U.S. Patent Documents", in column 1, line 6, after "B1" insert -- * --.

On the title page, item (56), under "U.S. Patent Documents", in column 1, line 6, after "et al." insert -- 438/778 --.

On the title page, item (56), under "Other Publications", in column 2, line 2, delete "Light" and insert -- Liquid --, therefor.

On the title page, item (56), under "Other Publications", in column 2, line 3, after "Society," insert -- 1999 --.

Signed and Sealed this

Twenty-seventh Day of November, 2007

JON W. DUDAS
*Director of the United States Patent and Trademark Office*